TRANSISTOR LOGIC OSCILLATOR

Filed March 1, 1967

INVENTOR.
Miroslav PECHOUCEK
BY Arthur O. Klein
his Attorney

INVENTOR.
Miroslav PECHOUCEK
BY
Arthur O. Klein
his Attorney

Feb. 18, 1969 M. PECHOUCEK 3,428,913

TRANSISTOR LOGIC OSCILLATOR

Filed March 1, 1967

INVENTOR:
Miroslav PECHOUCEK

BY Arthur O. Klein his Attorney

United States Patent Office 3,428,913
Patented Feb. 18, 1969

3,428,913
TRANSISTOR LOGIC OSCILLATOR

Miroslav Pechoucek, Prague, Czechoslovakia, assignor to Vyzkumzy Ustav Matematickych stroju, Prague, Czechoslovakia, a corporation of Czechoslovakia Filed Mar. 1, 1967, Ser. No. 619,823
Claims priority, application Czechoslovakia, Mar. 12, 1966, 1,667/66
U.S. Cl. 331—57 6 Claims
Int. Cl. H03b *5/20*; H03k *23/08*

ABSTRACT OF THE DISCLOSURE

A logic oscillator is formed by cascading odd numbers of transistor inverters into a plurality of groups that define overlapping closed loops. The normal delay in the inverters of each group due to carrier storage effects is adjusted so that positive feedback is established around each closed loop. Selected pairs of the inverters are connected together to form two-input NOR elements, with the separate inputs of each element being included in mutually distinct portions of a pair of overlapping closed loops and the output of the element being included in the common portions of the last-mentioned closed loops.

Figure 1A:
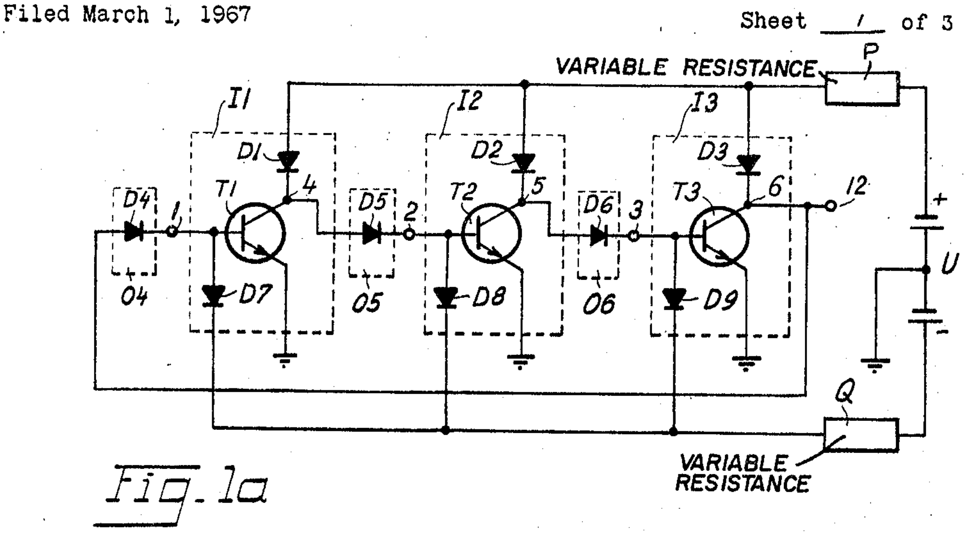

The invention relates to a circuit arrangement for producing oscillations.

Existing generators of oscillations comprise active four-poles, for example transistors, and also reactive two-poles, for example capacitors and inductances. The more advanced technology of producing such generators employs solid state circuitry. However, some circuits of these generators are rather complicated for solid state circuitry techniques, and some constructional elements used in these circuits, for example inductances and capacitors of large values, are difficult to produce by such techniques. Such inductances and capacitors are used in the generators for the purpose of achieving a voltage phase shift in the feedback loop.

It is a general object of the invention to eliminate the above mentioned drawbacks of the known state of art in the production of generators of oscillations.

A more specific object of the invention is to provide a generator of oscillations which in its simplest embodiment uses only transistors and resistors, and if solid state circuitry is used to construct the generator, only semi-conductor junctions are employed. In any case the generator in accordance with the invention, whether constructed by conventional techniques or by solid state techniques, does not require inductances or capacitors so that the construction of the generator becomes substantially simpler.

Another specific object of the invention is a circuit arrangement for producing oscillations or a generator of oscillations with single-stage combinational logic circuits of which at least three are members of a common feedback loop, a non-linear impedance being arranged in the common current circuit of two consecutive of these single-stage logic combinational circuits.

An advantage of the circuit arrangement in accordance with the invention resides in the fact that in accordance with the type of selected non-linear impedance it permits to construct generators of sinusoidal, sawtooth, triangular and other oscillations from transistors and semiconductor diodes of the same type, or resistors of the same value, and it permits also to construct various generators of trains of approximately rectangular pulses by selecting a circuit arrangement of single-stage logic combinational circuits in accordance with the invention.

The invention may be carried out by using various elements, for example electronic, magnetic and pneumatic.

The term "single-stage logic circuit" is used to indicate a circuit providing only a single logic function of input variables.

In the combinational logic circuits used in this invention the trailing edge of their output pulses lags behind the trailing edge of the ouput pulses which would leave this combinational circuit if it were ideal.

The term "ideal combinational logic circuit" indicates a logic circuit whose output value at a given moment is only a function of the input values at the same moment.

The above lag between the trailing edge of the output pulses of an actual and ideal combinational logic circuit, respectively, is due, for example, in directly coupled transistorized logic circuits to the carrier storage time which is the lag between the trailing edge of a pulse on the collector and the trailing edge of a pulse on the base of a transistor with a grounded emitter.

It should be apparent to those skilled in the art that the combinational logic circuits used in accordance with the invention achieve the voltage phase shift in the feedback loop of a generator of oscillations equally well as reactances, that is inductances or capacitors, used in accordance with the known state of art.

Figure 1B:
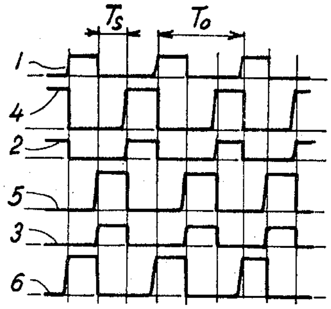
Figure 2A:
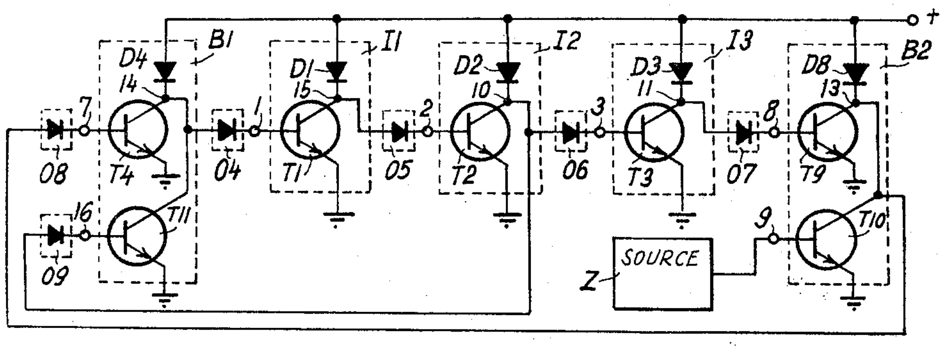
Figure 2B:
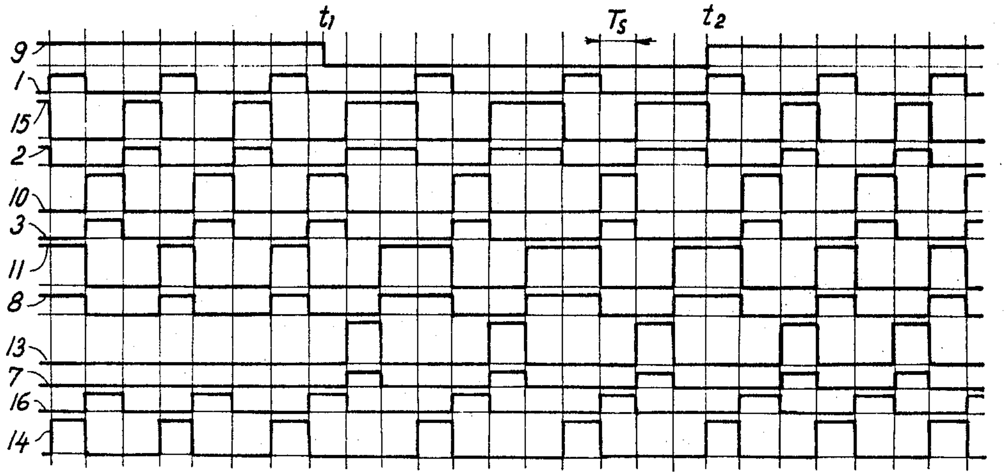

The above and other features and advantages of the invention will be best understood from the following description to be read in conjunction with the accompanying drawings illustrating preferred examples of embodiment. In the drawings:

FIG. 1*a* shows a generator of rectangular oscillations comprising inverters between which there are arranged diodes;

FIG. 1*b* illustrates the time behavior of a pulse train on the individual terminals of a generator according to FIG. 1*a*;

FIG. 2*a* illustrates a generator of pulse modulated rectangular oscillations with inverters and NOR circuits;

FIG. 2*b* shows the time behavior of pulses on the individual terminals of the circuit arrangement in FIG. 2*a*.

Figure 3:
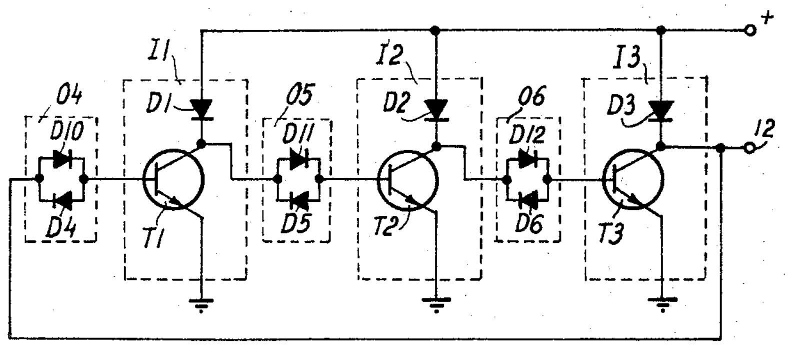
Figure 4A:
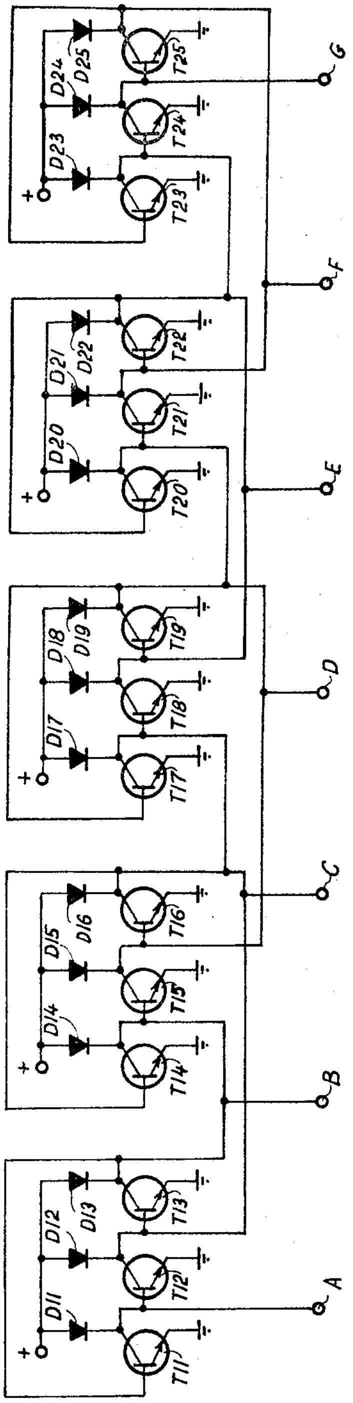
Figure 4B:
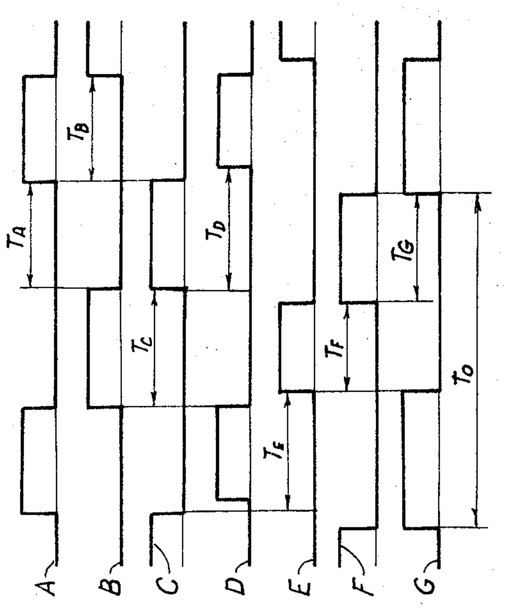

FIG. 3 shows a generator of sinusoidal oscillations with inverters and diodes for changing the shape of the generated oscillations;

FIG. 4*a* shows the interconnection of generators in accordance with the invention comprising three inverters; and FIG. 4*b* shows the time behavior of pulses corresponding to the network in FIG. 4*a*.

Referring now more particularly to FIG. 1a it should be understood that I1, I2 and I3 are inverters, that is NOR circuits for input pulses. Each of these circuits comprises one transistor T1, T2 and T3, respectively, and two diodes D1, D7; D2, D8, D3, D9, respectively. The transistor emitters are grounded. The collector of a preceding inverter is connected with the base of the transistor of a following inverter through non-linear impedance O5, O6, respectively, represented by diodes D5, D6, repsectively, connected in the forward direction with respect to the current of the base. The feedback is led from the collector of the last transistor T3 to the base of the first transistor T1 through a non-linear impedance O4 represented by a diode D4. The collectors of all three transistors T1 to T3 are fed through diodes D1 to D3 connected in the forward direction with respect to the collector current.

Through diodes D7 to D9 whose orientation is in agreement with the base-emitter junctions of the transistors T1, T2, T3 the bases of all three transistors are connected to the negative pole of the supply source U through a first element Q which may be passive or active, illustratively a variable resistor. The supply terminals of all inverters are connected to the positive pole of this source U through a second element P of a similar type as the first element Q. These elements P and Q permit to vary simultaneously the storage time of all logic inverters fed by the same supply source. One output terminal of the generator of the oscillations is indicated by I2.

If the network in FIG. 1*a* is permanently connected to the supply source U it bursts into oscillations under the effect of positive feedback as will be shown in the following description. The wave forms on the individual terminals 1, 2, 3, 4, 5, 6 are depicted in FIG. 1*b* where they are marked by the same reference numbers.

First there will be described a simplified circuit arrangement without considering the elements P and Q and the diodes D7, D8 and D9. This circuit comprises inverters operating with identical storage times T*s*. Suppose that the input terminal 1 of the inverter T1 is fed with pulses of a width T*s* and with a repetition period T*o* which equals three pulse widths T*s*. These pulses are illustrated by the course 1 in FIG. 1*b*. The pulse course occuring on the collector 4 of the transistor T1 in FIG. 1 is also marked 4 in FIG. 1*b*. With respect to the pulses 1 the pulses 4 have a reversed phase, and the trailing edge of each pulse 4 is delayed with respect to the trailing edge of a pulse 1 by a time T*s* due to the storage time between the voltage curve on the base and on the collector of a transistor with a grounded emitter. The pulses 4 fed through the conducting diode D5 to the terminal 2 of the inverter I2 cause pulses on the collector 5 arriving from this inverter to be in phase opposition with respect to the pulses 2, and the trailing edges of the former pulses 5 are delayed against the trailing edges of the pulses 2 by a time T*s*. During the storage time of the transistor T2 the diode D5 is non-conducting; therefore the charge stored on the base of the transistor T2 can only discharge through the diode D8 into the source U. It is therefore possible to control the storage time T*s* by the element Q. In the further inverters I1, I3 the diodes corresponding to the diodes D5, D8 work in a similar manner. Also the pulses on the terminal 3 of the inverter I3 produce on the collector 6 of the transistor T3 a wave form having the shape shown in FIG. 1*b*. It can be seen that these output pulses 6, which are fed back to the input terminal, are in phase with the input pulses 1.

It can be understood from the above that the circuit oscillates under effect of positive feedback, the oscillations on the individual terminals having the shapes depicted in FIG. 1*b*. The element P permits to vary simultaneously the magnitudes of the individual collector current of all transistors and thus also their storage times. If adjustment of the individual storage times of the transistors T1, T2 and T3 is not required, the diodes D7, D8 and D9, and therefore also the element Q may be omitted.

FIG. 2*a* shows another example of carrying out the invention. Here, the network consists of three inverters I1, I2, I3 arranged in series one after the other and comprising transistors T1, T2 and T3 and diodes D1, D2 and D3, like the inverters in FIG. 1*a* without the diodes D7, D8 and D9. In front of the inverter T1 there is arranged a circuit B1 operating as a NOR circuit, and comprising two transistors T4, T11 and diode D4. Between the individual inverters and NOR circuits there are interposed non-linear impedances O4 to O9, like the impedances O4 to O6 in FIG. 1*a*. The collectors of the two transistors T4 and T11 are interconnected and they are connected with the supply voltage through the diode D4 which is oriented in the forward direction with respect to the collector current. The base of the transistor T1 of the inverter I1 is connected through the impedance O4 with the interconnected collectors of the transistors T4 and T11 whose emitters are grounded. A NOR circuit B2 is interposed between the inverter I3 and the circuit B1 through non-linear impedances O7 and O8, the NOR circuit B2 comprising transistors T9, T10 and the diode D8 and being connected in a similar manner as the circuit B1.

There are two feedback branches in the circuit arrangement. One leads from the collector of the transistor T3 of the inverter I3 through the impedance O7, the base and the collector of the transistor T9 of the NOR circuit B2, through the impedance O8, and through the base and the collector of the transistor T4 of the circuit B1 and the impedance O4, to the base of the transistor T1 of the inverter I1. The second feedback branch leads from the collector of the transistor T2 of the inverter I2 through the impedance O9, and the base and the collector of the transistor T11 of the circuit B1, and through the non-linear impedance O4, to the base of the transistor T1. An external pulse source Z is connected to one input terminal 9 of the NOR circuit B2. The non-linear impedances O4 to O9 are preferably formed by diodes.

If the signal from the source Z on the terminal 9 is positive, the transistor T10 is conducting; there is then zero voltage on the terminal 7, and the transistor T4 is therefore cut-off. The courses of the oscillations on the terminals 1, 2 and 16 are determined solely by the feedback loop led through the transistors T1, T2 and T11, and through the non-linear impedance O4, O5 and O9. In this case the shapes and courses of the pulses on the terminals 1, 2 and 16 are similar to the courses 1, 2, 3 depicted in FIG. 1*b*. The difference resides in the fact that the storage time T*s* of the individual transistors is longer because there are not connected diodes similar to the diodes D7, D8 and D9 in FIG. 1*a*.

If during the time period between *t*1 and *t*2 the signal on the terminal 9 is zero, the transistor T10 is cut-off and the circuit B2 operates only as an inverter by the transistor T9 and the diode D8. Thus another feedback loop is created which leads through the transistors T1, T2, T3, T9 and T4, and the impedances O4 to O8. Suppose there is during the time period between *t*1 and *t*2 on the terminal 1 a course 1 depicted in FIG. 2*b*. Under effect of the storage times of the individual transistors the course 1 is transformed into course 2, or further courses 3, 8, 7. By negation of the logical sum of the courses 13 and 10 and under effect of the storage time of the circuit B1 there is produced a course 14 which, except for the amplitude, is identical with the supposed course 1. It can be seen from the above that the network operates with positive feedback as a generator producing pulses illustrated in FIG. 2*b*.

It can be seen from FIG. 2*b* that for example in the course 1 the time between the individual pulses is changed under effect of the source Z. This course is therefore pulse modulated.

Other embodiments of the circuit arrangement according to the invention can be carried out with any single-stage combinational logic circuits. For example from any output terminals of any number of single-stage combinational logic circuits are led feedback branches which may include any number of further single-stage combinational logic circuits, to separate input terminals of any single-stage combinational logic circuits contained in the network. From output terminals of circuits in the feedback branches, that is feedback elements, it is possible to lead in a similar manner further additional coupling branches comprising these single-stage combinational logic circuits arranged in cascades. By arranging feedback branches in the network it becomes possible to produce periodic pulse trains of different widths and repetition times.

Another example of the circuit arrangement of a generator of oscillations in accordance with the invention is illustrated in FIG. 3. It comprises three inverters I1, I2 and I3 arranged in series and connected in the same manner as the inverters in FIG. 2*a*. The non-linear impedances O4 to O6 are formed by diode circuits and they are connected so that always one diode circuit is connected between two adjacent inverters I1 to I3, between the collector of the preceding and the base of the following transistor. All three diode circuits are connected in an identical manner and each of them comprises two diodes D5, D11, or D4, D10, or D6, D12 which are arranged in parallel and with opposite polarity.

The diode circuits reduce the storage time and change the shape of the leading and trailing edges of the output pulses in such a manner that the shape of the output pulses taken from the collector of any transistor is not rectangular as in the preceding circuit arrangement, but on one it is sinusoidal, and this generator is conveniently used as a generator of sinusoidal oscillations.

In all above examples of carrying out the invention it is possible to use instead of each of the diodes in the collector circuit, for example D1 to D3 in FIG. 1*a* several diodes connected in series in order to obtain a higher collector impedance in circuits built by solid state techniques.

By using a resistor instead of the diodes D1 to D3 or also of the other diodes in the collector circuits shown in further figures it is possible to obtain a more economic circuit arrangement which may be an advantage in the case where integrated circuits are not used.

By selecting different non-linear impedances which may be designed, for example as one or more semiconducting junctions, or provided directly by the geometry of the base junction, or voltage or current dependent resistors which may be accompanied by voltage dependent capacitors produced on a semiconducting substrate, it is possible to obtain different shapes of the leading or trailing edges of the pulses and different storage times so that the produced periodical oscillations may for example have a saw-tooth, triangular, rectangular or other form.

The individual pulse generators represented by equal groups of three inverters have different repetition times due to production variations which produce different values of the storage times of the individual transistors. All these pulse generators can be mutually synchronized by mere interconnection of the output terminals. It depends on the selection of the connected terminals whether between pulses on output terminals lying on the same side of the illustrated generators following one after the other there will be approximately zero delay or a delay which is equal to one pulse width or two pulse widths. This permits for example to create a complete system of synchronizing pulses for a synchronous logic system only by means of partial generators of synchronizing pulses produced by the groups of three inverters, and to interconnect the partial generators conveniently, and this can be simply achieved in the solid state.

The circuit arrangement in FIG. 4*a* illustrates an example where between the pulses on the output terminals A to G of the groups of three inverters the delay equals one pulse width as can be seen from FIG. 4*b* illustrating the pulse shapes on the individual output terminals.

The circuit arrangement consists of an arbitrary number of groups of three inverters, in this case six. The groups of three inverters are connected in the same manner as the inverters I1, I2 and I3 in FIG. 3 with the difference that the non-linear impedances O4 to O6 are formed directly by the geometry of the base junction. The output terminal of the second inverter of each group of three inverters is connected to the output terminal of the third inverter of the following group, and the output terminal of the third inverter of each group of three is connected to the output terminal of the first inverter of the following group of three inverters.

If in the input of the transistor T11 operating with a storage time TA there are pulses B, then pulses A appear in its output, see FIG. 4*b*. Similarly the pulses B are formed from pulses C by transistors T13 and T14 whose base and collectors are interconnected so that both transistors are connected in parallel and operate with a resulting storage time TB. Since the collectors of the transistors T12, T16 and T17 are joined together and the base of the transistors T16 and T17 are also joined together they form with the collector diodes a NOR circuit for the course A and D operating with a storage time TC, the course C depicted in FIG. 4*b* appearing in the output of the circuit. Similarly, the pulses D are formed with a storage time TD from the input pulses B and E of the transistors T15, T19 and T20. Similarly, the pulses E are formed by transistors T18, T22 and T23 with a storage time TE from the input pulses C and F. Similarly the pulses F are produced by the transistors T21 and T25 from the input pulses D and G with a storage time TF. Together with the collector diodes the transistors T21 and T25 also form a NOR circuit. The pulses G are produced from the input pulses E by the transistor T24 operating with a storage time TG.

It can be seen from FIG. 4*b* that the mutual difference between the storage times are only due to differences in the delay of the leading and trailing edges, and therefore also in the pulse widths, and that the pulse courses on individual consecutive output terminals are mutually delayed approximately by their average width.

The repetition time T*o* is the same for all courses A to G. If the generators consisting of groups of three inverters are not interconnected, each individual generator produces usually pulses of different widths. With the generator circuitry in accordance with FIG. 4*a* one achieves by the mutual action of the individual pulses that the differences in the pulse widths are a minimum.

A further non-illustrated example of the invention is similar to the circuit arrangement illustrated in FIG. 4*a*. It also comprises equally connected groups of three inverters which are interconnected in such a manner that the output terminal of the second inverter of each group of three inverters is connected to the output terminal of the first inverter of the following group of three inverters, and the output terminal of the third inverter of each group of three inverters is connected to the output terminal of the second inverters of the following group of three inverters. This network operates in a similar manner as the network in FIG. 4*a* with the difference that the pulse courses on individual consecutive output terminals are mutual delayed approx. by two times their average width.

I claim:

1. In a transistor logic oscillator:
a plurality of transistor inverters each having a single input and an output and each manifesting an internal delay due to carrier storage effects;
means for cascading odd numbers of the inverters into a plurality of groups that define overlapping closed loops, each loop having at least three inverters; and
means for adjusting the delays of the cascade inverters in each group to establish positive feedback around each of the associated closed loops.

2. An oscillator as defined in claim 1, in which the cascading means comprises, in combination, first means for interconnecting selected pairs of the inverters in the oscillator to form two-input NOR elements, means for connecting separate inputs of each element in mutually distinct portions of the overlapping closed loops, and means for connecting the output of each element in the common portions of the overlapping closed loops.

3. An oscillator as defined in claim 2, in which the oscillator comprises a pair of the logical NOR elements and three additional inverters, and the cascading means comprises, in combination, means for connecting the three additional inverters between the output of a first one of the elements and a first input of a second one of the elements, means for coupling the output of the intermediate one of the additional inverters to the first input of the first element, means for connecting the output of the second element to a second input of the first element, and means for coupling modulating pulses to a second input of the second element.

4. An oscillator as defined in claim 1, in which the oscillator comprises 3N inverters (N being an integer), and the cascading means comprises, in combination, second means for interconnecting the inverters into N successive distinct groups individually arranged in closed loops and having three inverters each, and means for individually coupling the outputs of a pair of inverters in each of the first ($N-1$) groups to the outputs of a pair of inverters in the succeeding group.

5. An oscillator as defined in claim 4, in which the outputs of the intermediate and last inverters, respectively, in each of the first ($N-1$) groups are connected to the outputs of the last and first inverters, respectively, in the succeeding group.

6. In a logic pulse oscillator:

a plurality of transistor inverters each having a single input and an output;

means for cascading odd numbers of the inverters into a plurality of groups that individually define closed loops, each group having at least three inverters; and means for pairing selected inverters in separate groups into logical NOR elements with the inputs of each element being separately included in the closed loops defined by the last-mentioned groups and the output of each element being common to each of the closed loops defined by such groups.

References Cited

UNITED STATES PATENTS

| | | | |
|---|---|---|---|
| 3,047,817 | 7/1962 | Schneider | 331—57 |
| 3,235,796 | 2/1966 | Tarczy-Hornoch | 331—57 X |
| 3,350,659 | 10/1967 | Henn | 331—57 |

ROY LAKE, *Primary Examiner.*

S. H. GRIMM, *Assistant Examiner.*

U.S. Cl. X.R.

331—108, 136; 307—223